United States Patent [19]
Mashima

[11] Patent Number: 5,917,879
[45] Date of Patent: Jun. 29, 1999

[54] REFLECTIVE REDUCTION IMAGING OPTICAL SYSTEM FOR X-RAY LITHOGRAPHY

[75] Inventor: Kiyohito Mashima, Kawasaki, Japan

[73] Assignee: Nikon Corporation, Tokyo, Japan

[21] Appl. No.: 08/822,139

[22] Filed: Mar. 17, 1997

[30] Foreign Application Priority Data

Mar. 15, 1996  [JP]  Japan ................................. 8-087635

[51] Int. Cl.⁶ ....................................................... G21K 5/00
[52] U.S. Cl. ............................................. 378/34; 378/210
[58] Field of Search .......................................... 378/34, 35

[56] References Cited

U.S. PATENT DOCUMENTS 5,220,590  6/1993  Bruning et al. .
5,315,629  5/1994  Jewell et al. .

FOREIGN PATENT DOCUMENTS 63-311315  12/1988  Japan .

*Primary Examiner*—Craig E. Church
*Attorney, Agent, or Firm*—Chapman & Cutler

[57] ABSTRACT

A reflective reduction imaging optical system for X-ray lithography achieves good imaging performance using a simple construction. The system includes, from the side of mask M, first concave mirror $G_4$, plane mirror $G_3$, convex mirror $G_2$, and second concave mirror $G_1$ are placed, in that sequence, from the object side. The concave mirrors $G_4$ and $G_1$ and the convex mirror $G_2$ are formed in aspherical shapes. The convex mirror $G_2$ is placed at the pupil plane and the system becomes telecentric on the image side of wafer W.

15 Claims, 2 Drawing Sheets

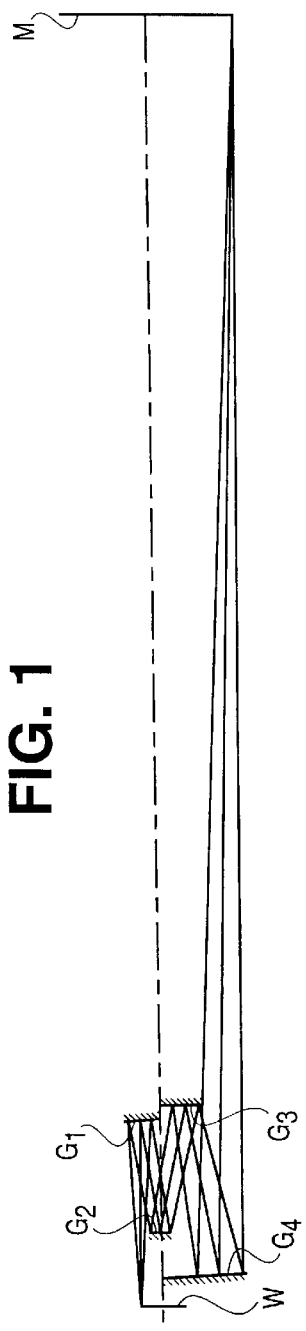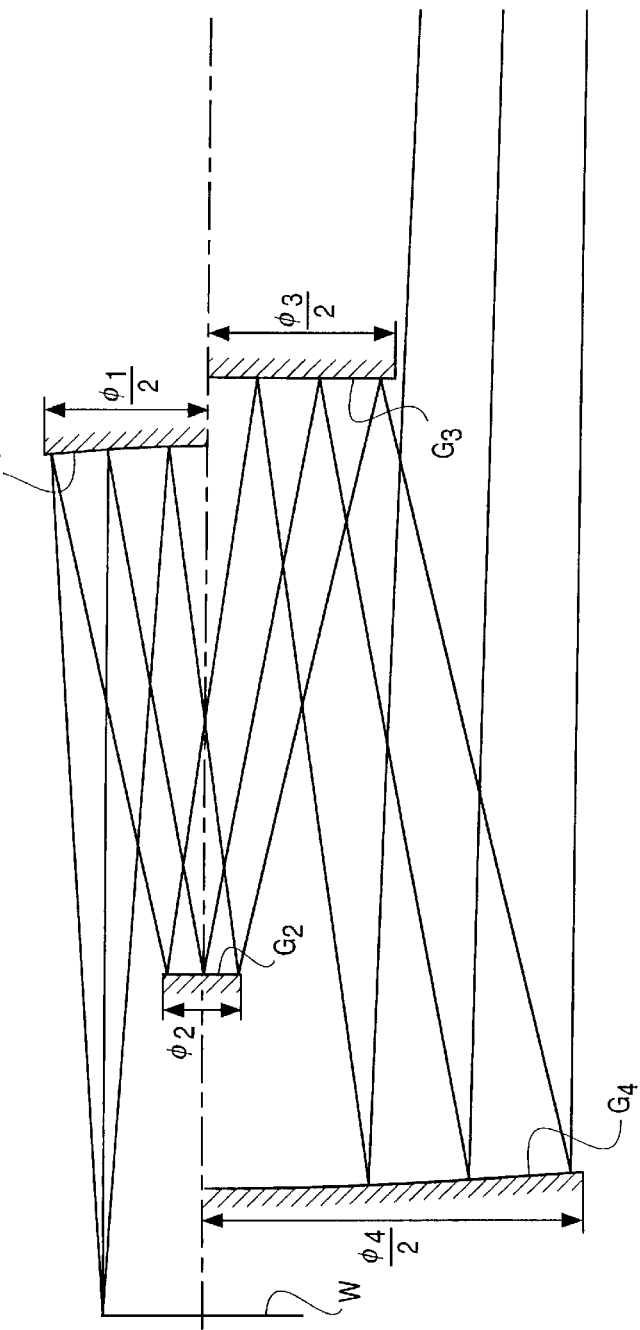
FIG. 1
FIG. 2

LATERAL ABERRATION (MEREDIONAL PLANE)

LATERAL ABERRATION (MEREDIONAL PLANE)

REFLECTIVE REDUCTION IMAGING OPTICAL SYSTEM FOR X-RAY LITHOGRAPHY

FIELD OF THE INVENTION

The invention pertains to a reflective reduction imaging optical system for X-ray lithography.

BACKGROUND OF THE INVENTION

With an increase in the level of integration of semiconductor devices, progress has been made in the technology using X-rays as the light source for the exposure of wafers.

Japanese Kokai Patent Application No. Sho 63 [1988]-311315 discloses a technology for the reduction exposure of wafers, with X-rays from the mask reflected by a first concave mirror, a convex mirror, and a second concave mirror, in that order. However, when using such a system in the synchronized scanning of a mask and wafers, the wafers interfere with the rays, which may lead to the rays being deflected.

The aforementioned Japanese patent also discloses a configuration for avoiding interference of the rays by the wafer during scanning by placing a plane mirror between the mask and the first concave mirror and/or a plane mirror between the second concave mirror and the wafer. However, with this configuration, since the incident angle of the X-rays on the plane mirror is about 45°, and the plane mirror for X-rays is formed as a laminated film, a phase shift takes place due to the difference in the incident angle, leading to aberration.

U.S. Pat. No. 5,315,629 discloses an optical system in which a first concave mirror, a plane mirror, a second concave mirror, and a third concave mirror are arranged coaxially, in that order, from the mask to the wafer. According to this system, it is possible to avoid interference of the rays by the wafer, but four aspherical mirrors are required. This is a disadvantage.

The purpose of this invention is to solve the problems of the aforementioned conventional systems by providing a reflective reduction imaging optical system for X-ray lithography that can provide a good imaging performance using a simple system.

SUMMARY OF THE INVENTION

In order to solve the aforementioned problems, the invention herein provides a reflective reduction imaging optical system for X-ray lithography formed by coaxially placing a first concave mirror, a plane mirror, a convex mirror, and a second concave mirror, in that order, from the object side, with the concave mirrors and convex mirror formed in aspherical shapes, the convex mirror being placed at the pupil plane. The system becomes telecentric on the image side.

BRIEF DESCRIPTION OF THE FIGURES

FIG. 1 is a schematic diagram illustrating a system according to this invention.

FIG. 2 is an enlarged view of the main portion, including the mirrors and the wafer, of the system of FIG. 1.

The following Symbols are used in the Figures:

| | |
|---|---|
| M | Mask |
| W | Wafer |
| $G_4$ | First concave mirror |
| $G_3$ | Plane mirror |
| $G_2$ | Convex mirror |
| $G_1$ | Second concave mirror |

DETAILED DESCRIPTION OF A PREFERRED EMBODIMENT

A preferred embodiment of this invention is described below. FIG. 1 illustrates an application example of the reflective reduction imaging optical system for X-ray lithography of this invention. FIG. 2 is a diagram illustrating its main portion. As can be seen from these figures, from the side of mask M to the side of wafer W, in order, the following mirrors are placed coaxially: first concave mirror $G_4$, plane mirror $G_3$, convex mirror $G_2$, and second concave mirror $G_1$. The concave mirrors $G_4$ and $G_1$, and the convex mirror $G_2$ are formed in aspherical shapes. The convex mirror $G_2$ is placed at the pupil plane, and the side of wafer W becomes telecentric.

The parameters of this application example are shown in Table I, which follows. In the "overall parameters", NA represents the numerical aperture and RF represents the ring field. In the "parameters of the mirrors", the first column represents the identification of the reflective surface from the side of wafer W, the second column r represents the apex radius of curvature of the various reflective surfaces, the third column d represents the distance between apexes of the various reflective surfaces, the fourth column κ represents the conical coefficient of each reflective surface, and the fifth column Φ represents the aperture.

The conical coefficient κ is defined by the following formula. Aspherical coefficient $C_n$ is set at 0 for each reflective surface. In this application example, the aspherical shapes are the so-called secondary aspherical surfaces. In particular, first concave mirror $G_4$ is formed as an ellipsoidal surface.

$$S(y) = \frac{y^2/r}{1+\sqrt{1-\kappa y^2/r^2}} + \sum_{i=2}^{N} C_{2i} y^{2i} \quad (N \geq 2)$$

wherein y is the height in the direction perpendicular to the optical axis;

S(y) is the displacement in the direction of the optical axis at height y;

r is the apex radius of curvature;

κ is the conical coefficient; and $C_n$ is the nth aspherical coefficient.

Aperture Φ refers to the aperture, including the portion actually cut off for guaranteeing the optical path.

TABLE I

"Overall parameters"
Magnification: ¼
Wafer-side NA: 0.06 (mask-side NA: 0.015)
Wafer-side RF inner radius: 29.8 (mask-side RF inner radius: 119.2)
Wafer-side RF outer radius: 30.0 (mask-side RF inner radius: 120)

TABLE I-continued

"Parameters of mirrors"

|  | r | d | κ | φ |
|---|---|---|---|---|
| W | — | 289.9966 | | |
| G₁ | −353.8219 | −176.50426 | 1.19513 | 73.8 |
| G₂ | −266.80893 | 200 | 1.38210 | 21.3 |
| G₃ | 0 | −271.76014 | — | 107.2 |
| G₄ | 1069.69783 | 2008.57114 | 0.41521 | 221.2 |
| M | — | | | |

Figure 3A:
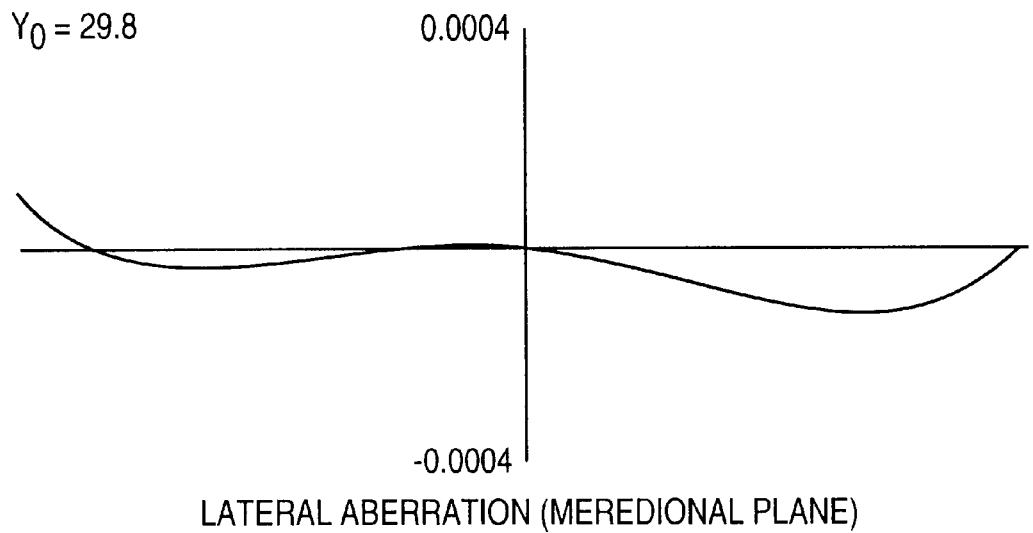
FIG. 3 is a schematic diagram illustrating the lateral aberration in the meridional plane.
Figure 3B:
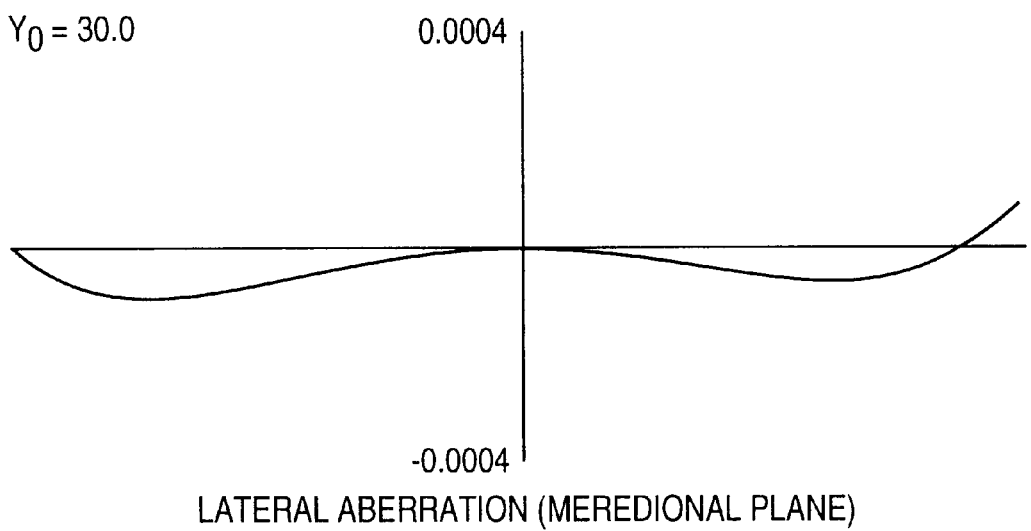

FIG. 3 is a diagram illustrating the lateral aberration on the meridional plane in this application example. This diagram shows the aberration on the mask M surface when an X-ray of 13 nm is incident from the side of wafer W. Consequently, height $Y_0$ of the object is the height on wafer W. It can be seen from this figure that good imaging performance is obtained in this application example.

As explained above, in this application example, by scanning with mask M and wafer W in synchronization with each other in the ring field, an exposure apparatus having a wide field is obtained. In the ring field, an image with a high resolution and a small skew aberration can be obtained.

Also, as the reduction side, that is, the wafer side, becomes the telecentric ring field, or the aperture stop position is on convex mirror $G_2$, it is possible to obtain the same exposure condition everywhere in the ring field.

As the optical path is reflected back by plane mirror $G_3$, there is no mechanical interference by the wafer in the optical path from the mask. Also, since the incident angles (the angle from the normal to the reflective surface) of the light beam on reflective surfaces $G_1$–$G_4$ are nearly 0°, it is possible to suppress the wavefront aberration caused by the phase shift by the various reflective surfaces.

In particular, in this application example, since a plane mirror and ellipsoidal mirrors are used, when these mirrors are manufactured, it is easy to obtain surfaces with a high precision. This is an advantage. In this application example, among the secondary aspherical surfaces, ellipsoidal and oblate spheroidal surfaces are used. However, it is also possible to use parabolic or hyperbolic surfaces for the secondary aspherical surfaces.

As described above, it is possible to obtain a reflective reduction imaging optical system for X-ray lithography with a good imaging performance and with a simple construction.

While the invention has been described above with respect to certain embodiments thereof, it will be appreciated by a person skilled in the art that variations and modifications may be made without departing from the spirit and scope of the invention.

What is claimed is:

1. A reflective reduction imaging optical system for X-ray lithography, for transferring patterns from a mask to a wafer, the system employing an X-ray source and comprised by coaxially placing, in the following sequence from said source and the mask, a first concave mirror, a plane mirror, a convex mirror, and a second concave mirror, with said concave mirrors and said convex mirror formed with mirror surfaces having aspherical shapes, said convex mirror being placed at a pupil plane, and wherein the system becomes telecentric on an image side of said wafer.

2. The reflective reduction imaging optical system for X-ray lithography according to claim 1, wherein in said concave mirrors and said convex mirror, at least two of said mirror surfaces are formed in different aspherical shapes.

3. The reflective reduction imaging optical system for X-ray lithography according to claim 1, wherein at least one said mirror surface is formed in a shape selected from the group comprising ellipsoid, parabolic, and hyperbolic shapes.

4. The reflective reduction imaging optical system for X-ray lithography according to claim 2, wherein at least one said mirror surface is formed in a shape selected from the group comprising ellipsoid, parabolic and hyperbolic shapes.

5. The reflective reduction imaging optical system for X-ray lithography according to claim 3, wherein at least one said mirror surface is formed with an oblate spheroidal surface.

6. The reflective reduction imaging optical system for X-ray lithography according to claim 4, wherein at least one said mirror surface is formed with an oblate spheroidal surface.

7. The reflective reduction imaging optical system for X-ray lithography according to claim 1, wherein the mask and wafer are adapted for being scanned in synchronization with each other in a ring field.

8. The reflective reduction imaging optical system for X-ray lithography according to claim 1, wherein the aspherical shapes are formed as secondary aspherical surfaces chosen from the group comprising ellipsoidal and oblate spherical surfaces, parabolic surfaces, and hyperbolic surfaces.

9. The reflective reduction imaging optical system for X-ray lithography according to claim 8, wherein the first concave mirror has an ellipsoidal surface, and $$S(y) = \frac{y^2/r}{1+\sqrt{1-\kappa y^2/r^2}} + \sum_{i=2}^{N} C_{2i} y^{2i} \quad (N \geq 2)$$

wherein y is the height in the direction perpendicular to the optical axis; S(y) is the displacement in the direction of the optical axis at height y; r is the apex radius of curvature; κ is the conical coefficient; and $C_n$ is the nth aspherical coefficient.

10. The reflective reduction imaging optical system for X-ray lithography according to claim 1, wherein the X-rays are focused onto said wafer and a side of said wafer becomes a telecentric ring field.

11. The reflective reduction imaging optical system for X-ray lithography according to claim 2, wherein the X-ray beam is focused on said wafer and one side of said wafer becomes telecentric.

12. The reflective reduction imaging optical system for X-ray lithography according to claim 1, wherein an aperture stop is located on the convex mirror surface.

13. The reflective reduction imaging optical system for X-ray lithography according to claim 1, wherein the X-ray beam is focused on said wafer and one side of said wafer becomes telecentric.

14. The reflective reduction imaging optical system for X-ray lithography according to claim 1, wherein in an optical path in the system between a mask and a wafer, there is no mechanical interference in the optical path by the wafer.

15. The reflective reduction imaging optical system for X-ray lithography according to claim 1, wherein incident angles of X-rays on reflective surfaces of said mirrors are nearly 0°.

* * * * *